United States Patent
Haridas et al.

(10) Patent No.: US 7,464,243 B2
(45) Date of Patent: Dec. 9, 2008

(54) METHOD AND APPARATUS FOR ARBITRARILY INITIALIZING A PORTION OF MEMORY

(75) Inventors: Sriram Haridas, Cary, NC (US); Martin Hughes, Cary, NC (US); William Lee, Cary, NC (US); John Mitten, Cary, NC (US)

(73) Assignee: Cisco Technology, Inc., San Jose, CA (US)

(*) Notice: Subject to any disclaimer, the term of this patent is extended or adjusted under 35 U.S.C. 154(b) by 386 days.

(21) Appl. No.: 11/018,368

(22) Filed: Dec. 21, 2004

(65) Prior Publication Data

US 2006/0136682 A1 Jun. 22, 2006

(51) Int. Cl.
*G06F 12/00* (2006.01)

(52) U.S. Cl. .................. 711/170; 711/159; 711/163
(58) Field of Classification Search .................. 711/166
See application file for complete search history.

(56) References Cited

U.S. PATENT DOCUMENTS

| | | | | |
|---|---|---|---|---|
| 4,236,207 A | * | 11/1980 | Rado et al. ................. | 711/166 |
| 4,247,905 A | * | 1/1981 | Yoshida et al. ............. | 711/166 |
| 5,263,139 A | * | 11/1993 | Testa et al. ................. | 710/307 |
| 5,619,513 A | * | 4/1997 | Shaffer et al. .............. | 714/736 |
| 5,943,689 A | * | 8/1999 | Tamer ........................ | 711/166 |
| 6,282,135 B1 | | 8/2001 | Proebsting | |
| 6,366,989 B1 | | 4/2002 | Keskar et al. | |
| 6,601,153 B1 | | 7/2003 | Engelbrecht et al. | |
| 6,647,503 B1 | | 11/2003 | Kuroda | |
| 6,766,447 B1 | | 7/2004 | Jue et al. | |
| 6,791,892 B2 | | 9/2004 | Bae et al. | |

OTHER PUBLICATIONS

Handy, Jim. The Cache Memory Book. C.A., Academic Press, Inc., 1998. pp. 126-127. TK7895.M4H35.*
Fairhurst, Gorry. Operation of a Router. [retrieved on Dec. 13, 2006]. Retrieved from the Internet <URL: http://www.erg.abdn.ac.uk/users/gorry/course/inet-pages/router-opn.html>.*

* cited by examiner

*Primary Examiner*—Reginald G. Bragdon
*Assistant Examiner*—Larry T Mackall
(74) *Attorney, Agent, or Firm*—Evans & Molinelli PLLC; Eugene Molinelli

(57) ABSTRACT

Techniques for initializing an arbitrary portion of memory with an arbitrary pattern includes using a memory controller for performing sequenced read and write operations. The memory controller receives address data, length data and pattern data on a data bus connected to a processor. The address data indicates a location in memory. The length data indicates an amount of memory to be initialized. The pattern data indicates a particular series of bits that is much shorter than the amount of memory indicated by the length data. The memory controller performs multiple write operations on memory beginning at a first location based on the address data and ending at a second location based on the length data. Each write operation writes the pattern data to a current location in memory, thereby initializing the arbitrary portion of memory with an arbitrary pattern based on the pattern data.

21 Claims, 8 Drawing Sheets

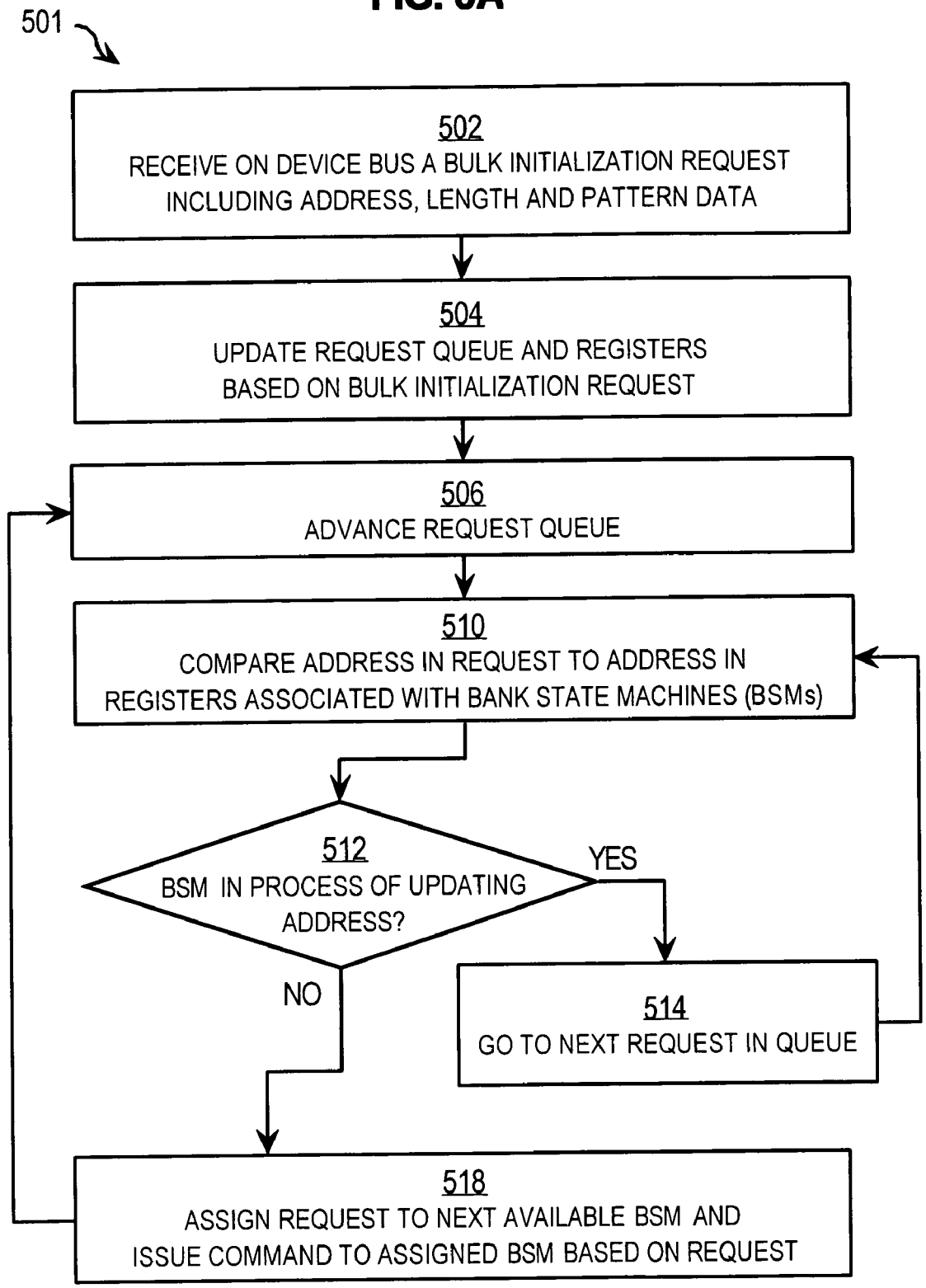

METHOD AND APPARATUS FOR ARBITRARILY INITIALIZING A PORTION OF MEMORY

BACKGROUND OF THE INVENTION

1. Field of the Invention

The present invention relates to setting contents of memory for initializing data structures; and, in particular, to increasing efficiency by issuing a single command to set an arbitrary state in an arbitrary portion of memory using a memory controller.

2. Description of the Related Art

Networks of general purpose computer systems connected by external communication links are well known. The networks often include one or more network devices that facilitate the passage of information between the computer systems. A network node is a network device or computer system connected by the communication links.

Routers and switches are network devices that determine which communication link or links to employ to support the progress of data packets through the network. Routers and switches can employ software executed by a general purpose processor, called a central processing unit (CPU), or can employ special purpose hardware, or can employ some combination to make these determinations and forward the data packets from one communication link to another.

While the use of hardware causes data packets to be processed extremely quickly, there are drawbacks in flexibility. As communications protocols evolve through subsequent versions and as new protocols emerge, the network devices that rely on hardware become obsolete and have to ignore the new protocols or else be replaced. As a consequence, many network devices, such as routers, which forward packets across heterogeneous data link networks, include a CPU that operates according to an instruction set (software) that can be modified as protocols change. The software set constitutes a networking operating system, such as the Cisco Internet Operating System (IOS) available from Cisco Systems of San Jose, Calif.

Software executed operations in a CPU proceed more slowly than hardware executed operations, so there is a tradeoff between flexibility and speed in the design and implementation of network devices.

The throughput of many current routers is limited by the processing capacity of the CPU, i.e., the router performance is said to be CPU limited. To improve throughput of such routers, it is desirable to relieve the CPU load and replace some of the software functionality in the operating system with hardware functionality, without losing the flexibility to adapt to evolving protocols.

A very common routine that is called by a network operating system is a function to set each element in an array of data structure elements in memory with an initial value, i.e., to "initialize" the data structure array. In IOS, this function is provided by the software routine memset. When memset is called, an instruction is executed by the CPU for each location in memory. For example, to allocate memory for a hash table with 4000 entries, which is used to associate data packets with data flows and corresponding routing parameters, memset causes the CPU to issue 4000 store instructions for main memory, which is used as input and output memory (IOMEM) for storing input data and output data. Store instructions for IOMEM are sent directly to a parallel communication channel (a "bus" described in more detail in a later section) connecting the CPU to a memory controller (also described in more detail in a later section) for exchanging data with main memory. Thus, 4000 store instructions are sent over the bus to the memory controller. Each store instruction involves a burst of data involving several clock cycles on the bus. For example, in a Cisco 7200 Series router available from Cisco Systems, using a CPU Architecture from MIPS Technologies, Inc. of Mountain View, Calif., each data burst involves up to 40 bytes and 5 clock cycles on a fast device bus (FDB) connection between the CPU and a memory controller. Therefore, the 4000 store instructions can consume 20,000 cycles on the bus. The CPU and bus resources consumed to perform the memset operation are preferably utilized to perform other IOS functions.

In some start-up ("boot-strap," or "boot") operations, a CPU issues a single command to initialize memory. However, such operations typically initialize all memory with a preset value, such as all zeros. Similarly, some display controllers initialize all memory location indicating picture element (pixel) values to a preset value, e.g., representing a blue or black screen. These operations are not capable of setting an arbitrary section of memory, like 4000 hash table entries, to an arbitrary value that is determined by the programmable instruction set.

In one approach, a direct memory access (DMA) controller could be used to move data from a constant address to a target memory array. However, this approach requires the CPU either to wait and repeatedly poll the DMA for the status of the operation, or to wait for an interrupt sent by the DMA, before proceeding with usage of the initialized array in memory. Polling consumes multiple CPU and bus cycles that are preferably utilized for other IOS functions. Processing interrupts consumes CPU resources to switch the context of the CPU with a stack of instructions and data in memory. In addition, existing DMA controllers perform a memory read in addition to a memory write for every store instruction. Therefore, using a DMA controller to initialize 4000 entries in a hash table consumes further system resources to not only, write 4000 entries, but also to read 4000 entries, in addition to consuming resources to poll or process interrupts. Thus, the approaches using a DMA controller consume system resources that are preferably utilized for other IOS processing.

Based on the foregoing, there is a clear need for techniques to initialize blocks of memory with an arbitrary value, while reducing the number of CPU instructions, or reducing the amount of bus traffic, or reducing the burden on the CPU to determine when the initialization is complete, or some combination of these reductions.

The approaches described in this section could be pursued, but are not necessarily approaches that have been previously conceived or pursued. Therefore, unless otherwise indicated herein, the approaches described in this section are not to be considered prior art to the claims in this application merely due to the presence of these approaches in this background section.

BRIEF DESCRIPTION OF THE DRAWINGS

The present invention is illustrated by way of example, and not by way of limitation, in the figures of the accompanying drawings and in which like reference numerals refer to similar elements and in which:

FIG. 5A is a flow diagram that illustrates a method performed by a request queue manager in a memory controller, according to an embodiment;

DETAILED DESCRIPTION

Figure 1:
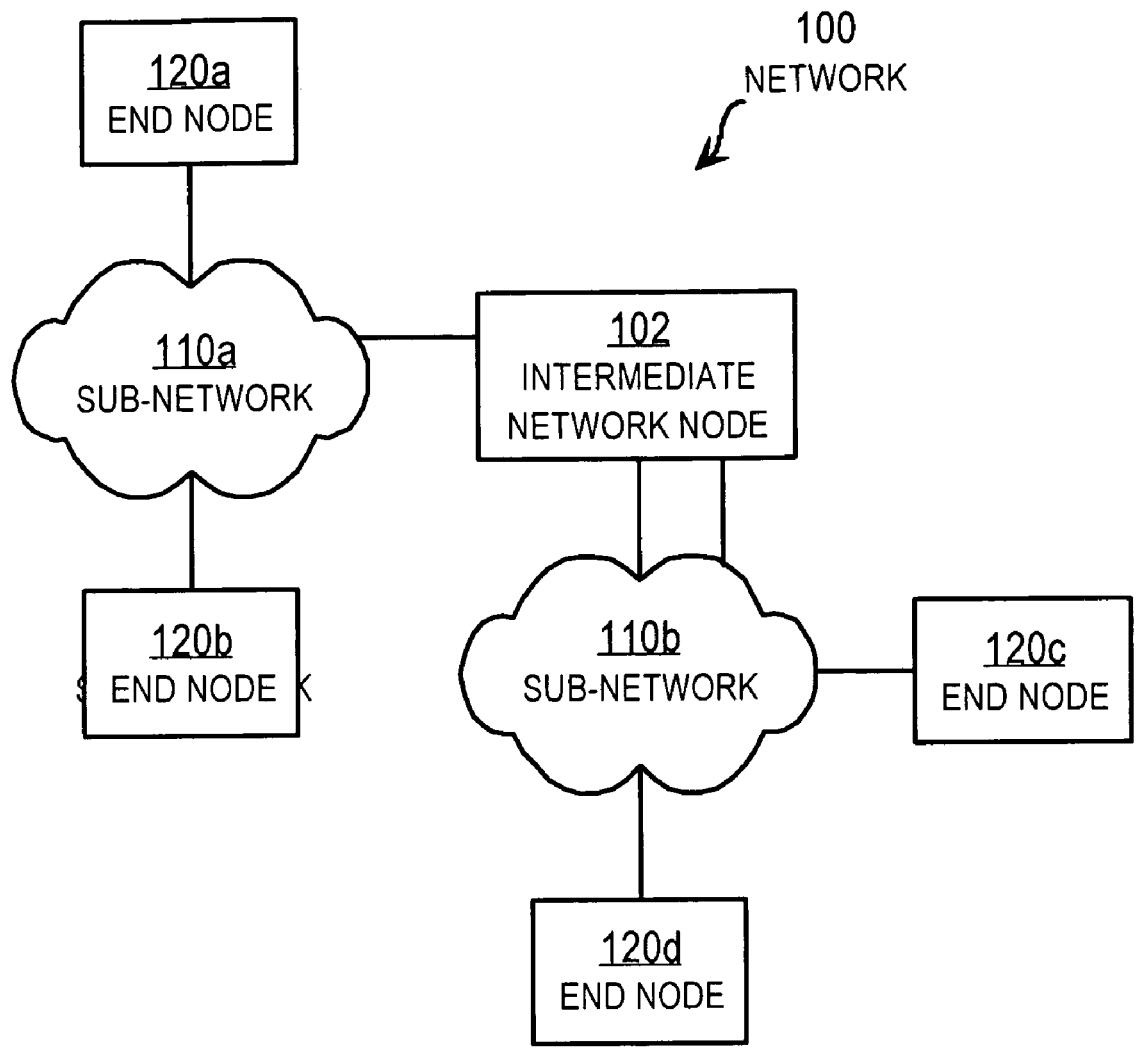
FIG. 1 is a block diagram that illustrates a network, according to an embodiment.

A method and apparatus are described for initializing an arbitrary portion of memory. In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

Techniques are provided for initializing an arbitrary portion of memory with an arbitrary pattern using a memory controller for performing sequenced read and write operations.

In a first set of embodiments, an apparatus includes a memory controller that receives address data, length data and pattern data on a data bus connected to a processor. The address data indicates a location in memory. The length data indicates an amount of memory to be initialized. The pattern data indicates a particular series of bits that is much shorter than the amount of memory indicated by the length data. The memory controller performs multiple write operations on memory beginning at a start location based on the address data and ending at an end location based on the length data. Each write operation writes the pattern data to a current location in memory, thereby initializing the arbitrary portion of memory with an arbitrary pattern based on the pattern data.

In some embodiments of the first set, the memory controller also blocks a subsequent request for access to a particular location in memory in a range from the start location to the end location until after the pattern data is written to the particular location. This allows a CPU to continue to perform operations without determining whether the memory controller has completed the initialization of the memory. The memory controller can be relied upon to sequence subsequent read and write operations that involved the initialized portion of memory.

In some of these embodiments, blocking subsequent requests includes incrementing address data in a progress register. The address data indicates a current location in memory where the pattern data is being written. It is determined whether the particular location is in a range from the current location to the end location. If so, then the subsequent request for access to the particular location is blocked. In some of these embodiments, if the particular location is in a range from the start location to a location before the current location, then the request for access to the particular location is satisfied.

In a second set of embodiments for routing information in a data packet, an apparatus includes a network interface that is coupled to a network for communicating a data packet with the network, a memory for storing information, one or more processors, and a data communication channel connected to the one or more processors. A memory controller is connected to the memory and connected to the data communication channel. The memory controller is configured to receive address data, length data and pattern data on the data communication channel. The address data indicates a location in memory; and the length data indicates an amount of memory to be initialized. The pattern data indicates a particular series of bits that is much shorter than the amount of memory indicated by the length data. The memory controller performs multiple write operations to memory beginning at a start location in memory based on the address data and ending at an end location in memory based on the length data. Each write operation writes the pattern data to a current location in memory; thus an arbitrary portion of memory is initialized with an arbitrary pattern based on the pattern data. The apparatus includes one or more sequences of instructions that cause the one or more processors to initialize the arbitrary portion of memory for storing, routing or sending the data packet by sending the address data, length data and pattern data to the memory controller. Therefore, the processors can free clock cycles that would otherwise be consumed in repeatedly sending the pattern data on the data communication channel for memory locations from the start location to the end location. The one or more processors also perform at least one of storing, routing and sending the data packet based at least in part on information subsequently stored in the arbitrary portion of memory.

In other sets of embodiments, methods, a computer readable medium, and other apparati provide corresponding functions described for one or more of the above sets of embodiments.

In the following description, embodiments are described in the context of a CPU and memory controller used in a router for controlling the passage of data packets over a network; but, the invention is not limited to this context. In other embodiments, the initialization of memory may be performed by a memory controller in any device using a general purpose processor and a separate computer memory. For example, in some embodiments, upon powering a device, a CPU and memory controller initialize an entire memory by setting the contents of every memory address to a value of zero, and then reset the contents of every address to 1, and then perform error detection. In some embodiments, one or more portions of a graphic memory in a graphics controller are initialized with a pattern that displays as a smooth or textured screen.

1.0 Network Overview

FIG. 1 is a block diagram that illustrates a network 100, according to an embodiment. A computer network is a geographically distributed collection of interconnected sub-networks (e.g., sub-networks 110a, 110b, collectively referenced hereinafter as sub-network 110) for transporting data between nodes, such as computers. A local area network (LAN) is an example of such a sub-network. The network's topology is defined by an arrangement of end nodes (e.g., end nodes 120a, 120b, 120c, 120d, collectively referenced hereinafter as end nodes 120) that communicate with one another, typically through one or more intermediate network nodes, e.g., intermediate network node 102, such as a router or switch, that facilitates routing data between end nodes 120. As used herein, an end node 120 is a node that is configured to originate or terminate communications over the network. In contrast, an intermediate network node 102 facilitates the passage of data between end nodes. Each sub-network 110b includes zero or more intermediate network nodes. Although, for purposes of illustration, intermediate network node 102 is connected by one communication link to sub-network 110a and thereby to end nodes 120a, 120b and by two communication links to sub-network 110b and end nodes 120c, 120d, in other embodiments an intermediate network node 102 may be connected to more or fewer sub-networks 110 and directly or indirectly to more or fewer end nodes 120 and directly to more other intermediate network nodes.

Information is exchanged between network nodes according to one or more of many well known, new or still developing protocols. In this context, a protocol consists of a set of rules defining how the nodes interact with each other based on information sent over the communication links. The protocols are effective at different layers of operation within each node, from generating and receiving physical signals of various types, to selecting a link for transferring those signals, to the format of information indicated by those signals, to identifying which software application executing on a computer system sends or receives the information. The conceptually different layers of protocols for exchanging information over a network are described in the Open Systems Interconnection (OSI) Reference Model. The OSI Reference Model is generally described in more detail in Section 1.1 of the reference book entitled *Interconnections Second Edition*, by Radia Perlman, published September 1999, which is hereby incorporated by reference as though fully set forth herein.

Communications between nodes are typically effected by exchanging discrete packets of data. Each data packet typically comprises 1] header information associated with a particular protocol, and 2] payload information that follows the header information and contains information to be processed independently of that particular protocol. In some protocols, the packet includes 3] trailer information following the payload and indicating the end of the payload information. The header includes information such as the source of the data packet, its destination, the length of the payload, and other properties used by the protocol. Often, the data in the payload for the particular protocol includes a header and payload for a different protocol associated with a different, higher layer of the OSI Reference Model. The header for a particular protocol typically indicates a type for the next protocol contained in its payload. The higher layer protocol is said to be encapsulated in the lower layer protocol. The headers included in a data packet traversing multiple heterogeneous networks, such as the Internet, typically include a physical (layer 1) header, a data-link (layer 2) header, an internetwork (layer 3) header and a transport (layer 4) header, as defined by the Open Systems Interconnection (OSI) Reference Model.

As used herein, a data flow is a stream of data packets that is communicated from a source node to a destination node. Each packet in the flow satisfies a set of predetermined criteria, e.g., based on the packet's contents, size or relative temporal or spatial position in the data flow. An intermediate network node may be configured to perform "flow-based" routing operations so as to route each packet in a data flow in the same manner. The intermediate node typically receives data packets in the flow and forwards the packets in accordance with predetermined routing information that is distributed in data packets using a routing protocol, such as the Open Shortest Path First (OSPF) protocol. One or more large hash tables and other large data structures typically are used by the routing protocol.

Each of these data structures, such as the hash table and the linked list entries, among others, are formed in memory by reserving a portion of memory to hold these data. In addition, the values stored in the portion of memory reserved for each data structure indicates whether an entry holds data for an active data flow or not. The entries in the data structures are often initialized to hold values that indicate that no active data flow is yet associated with the entry. Because the data structures can hold a large number of entries, the process of storing the initial values in all these entries can consume considerable CPU and device bus resources.

According to some embodiments of the invention described below, the intermediate network node 102 is configured to reduce the burden on a central processing unit in the routing of data flows by reducing the consumption of CPU and device bus resources in initializing the data structures used by the routing operating system.

2.0 Structural Overview

A router which may serve as the network node 102 in some embodiments is described in greater detail in a later section with reference to FIG. 6. At this juncture, it is sufficient to note that the router 600 includes a general purpose processor 602 (i.e., a CPU), a main memory 604, and a switching system 630 connected to multiple network links 632. According to some embodiments of the invention, switching system 630 is modified as described in this section.

Figure 2A:
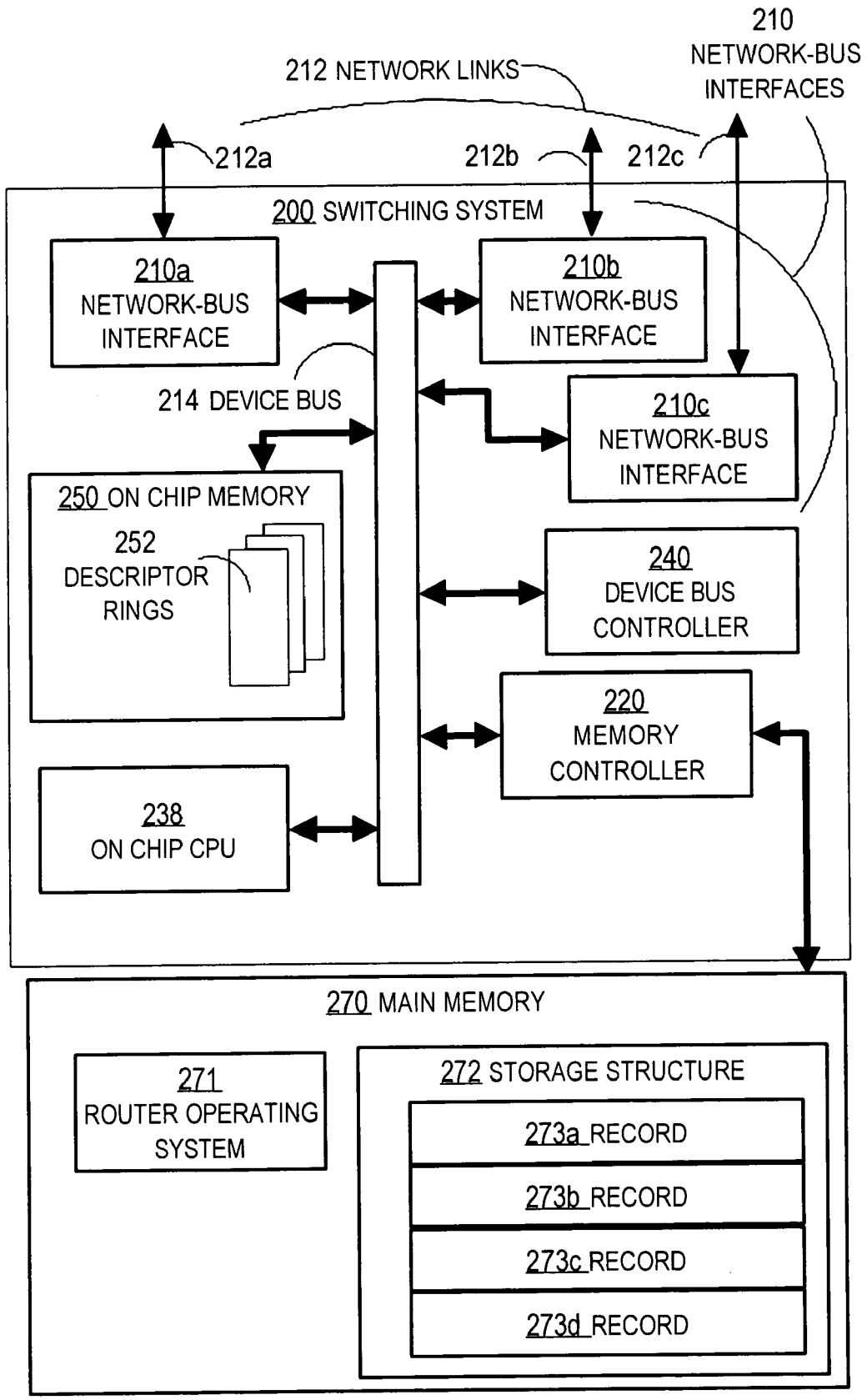
FIG. 2A is a block diagram that illustrates a switching system in a router that uses a main memory of the router, according to an embodiment.

FIG. 2A is a block diagram that illustrates a switching system 200 that uses a main memory 270 of a router (e.g., memory 604 of router 600) to control the routing of data packets across network links 212 (e.g., 632), according to an embodiment. The switching system 200 includes a device bus 214, device bus controller 240, multiple network-bus interfaces 210, on-chip CPU 238, main memory controller 220 and on-chip memory 250.

The device bus 214 is a local bus for passing data between the components of switching system 200. In some embodiments, the device bus 214 is a fast device bus (FDB) that has greater bandwidth than a main bus used with main memory, such as bus 610 depicted in FIG. 6 and described in a later section.

Each network-bus interface 210, such as network-bus interfaces 210a, 210b, 210c, includes circuitry and logic to couple the device bus 214 to a network link 212, described in a later section.

The memory controller 220 comprises circuitry and logic configured to store and retrieve data in main memory 270. In some embodiments, main memory controller 220 is connected directly to a main bus for transferring data to the main memory. In some embodiments, main memory controller sends data to main memory 270 by transferring data through a main bus interface. The memory controller 220 for an embodiment of the invention is described in more detail below with reference to FIG. 2B The on-chip CPU 238 is a general purpose processor that performs operations on data based on instructions received by the CPU 238, as described in more detail below for processor 602. In some embodiments, multiple on-chip CPUs are included. Although the illustrated on-chip CPU 238 is situated in the switching system 200, it is also expressly contemplated that the on-chip CPU may reside in a separate module coupled to the switching system 200, or the functions performed by the on-chip CPU 238 (or a portion thereof) may be performed by a separate CPU connected to the main bus (such as CPU 602 connected to main bus 610, described below). In some embodiments, on-chip CPU 238 is omitted.

The bus controller 240 comprises circuitry and logic that, among other operations, implements an arbitration policy for coordinating access to the device bus 214. That is, the controller 240 prevents two or more entities, such as the network-bus interfaces 210, memory controller 220, etc., from attempting to access the bus 214 at substantively the same time. To that end, the bus controller 240 may be configured to grant or deny access to the bus 214 based on a predefined arbitration protocol.

The on-chip memory 250 comprises a set of addressable memory locations resident on the switching system 200. The on-chip memory may be a form of volatile memory, such as static RAM (SRAM), or a form of erasable non-volatile memory, such as Flash memory. Although the illustrated on-chip memory 250 is situated in the switching system 200, it is also expressly contemplated that the on-chip memory may reside in a separate memory module coupled to the switching system 200, or the contents of the on-chip memory (or a portion thereof) may be incorporated into the main memory 270.

The on-chip memory 250 stores, among other things, one or more descriptor rings 252. As used herein, a ring is a circular first-in, first-out (FIFO) queue of records, where a record is a number of fields stored in a certain number of bytes. Each network interface in a network bus interface 210 is associated with at least one ring 252 in the on-chip memory 250.

The main memory 270 includes instructions from a router operating system 271, and routing information in one or more storage structures 272, such as a storage structure for a hash table, linked list, descriptor ring, or data buffers for storing packet payload data. At least one storage structure includes multiple entries 273, e.g, entries 273a, 273b, 273c, 273d. In an illustrated embodiment, memory 270 is divided into several banks. And each bank is divided into multiple pages of storage. Any type of memory may be used for main memory 270, including dynamic random access memory (DRAM), synchronous DRAM (SDRAM), and double data rate (DDR) memory which is a type of SDRAM in which data is sent in a data burst on both the rising and falling edges of a clock cycle.

Figure 2B:
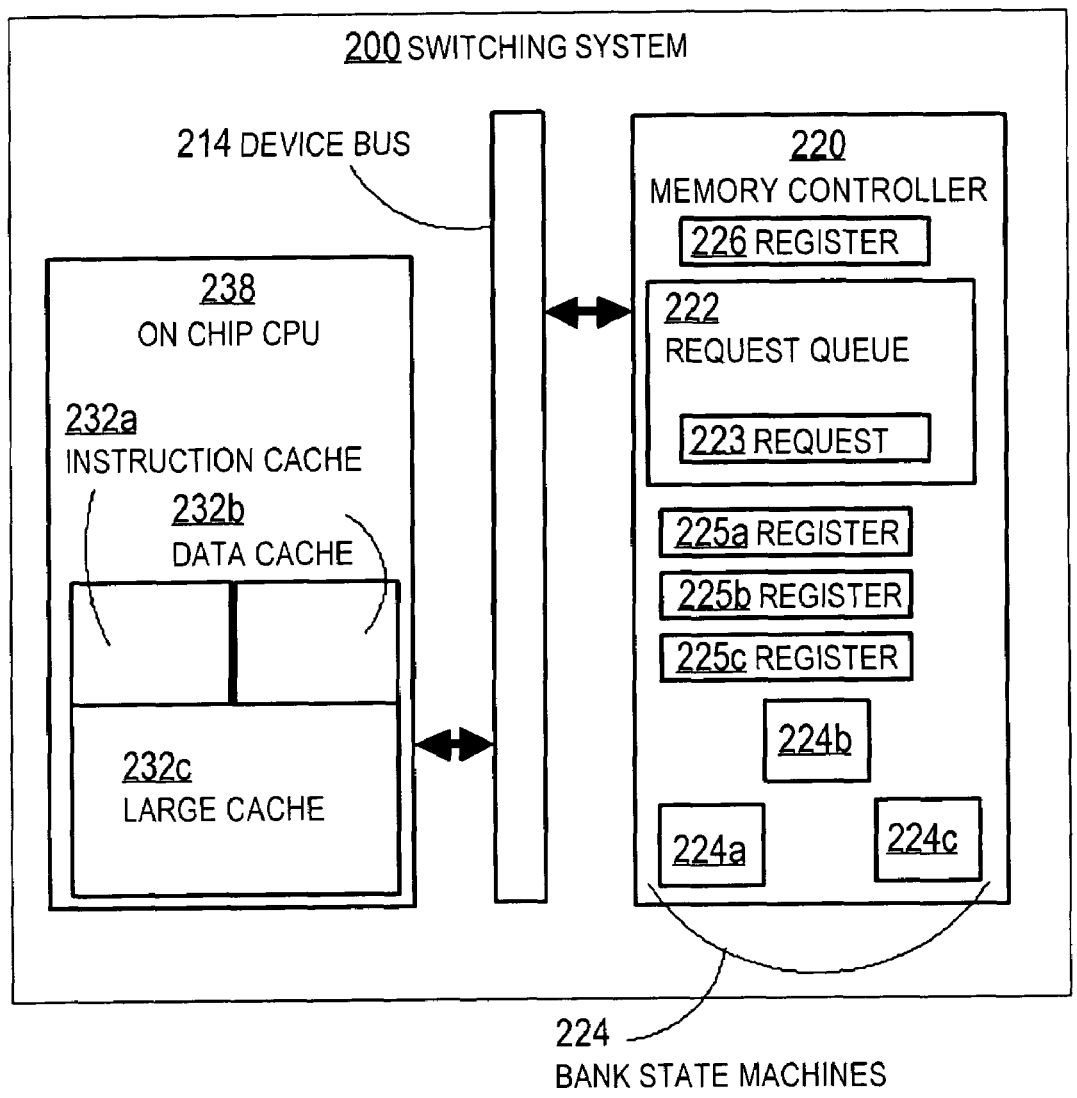
FIG. 2B is a block diagram that illustrates a CPU and a memory controller configured to set an arbitrary portion of memory to an arbitrary pattern of bits, according to an embodiment in a router.

FIG. 2B is a block diagram that illustrates a switching system 200 in a router with a CPU 238 and a memory controller 220 configured to initialize an arbitrary portion of main memory 270 to an arbitrary pattern of bits, according to an embodiment. For example, the CPU 238 and memory controller 220 initialize storage structure 272, such as a hash table, so that every entry 273 has a value that indicates no data flow, and therefore no linked-list, is associated with that entry of the hash table. For purposes of illustration, it is assumed that storage structure 272 includes 4000 entries 273, that each entry 273 is a four byte field (one byte=8 binary digits, "bits"), and that 16 bits of 0 followed by 16 bits of 1 indicate no data flow and associated linked-list. Thus, during initialization of storage structure 272, 16 bits of 0 followed by 16 bits of 1 are placed into each entry 273 of 4000 data entries in the storage structure 272.

The CPU 238 includes cache for holding instructions and data for ready access after retrieving data and instructions from memory and before storing data into memory. In an illustrated embodiment of a MIPS CPU, two caches are used. A first cache, L1, is a small fast cache, proximate to the arithmetic and logic circuitry, which includes both an instruction cache 232a and a data cache 232b. A second cache, L2, is a large cache 232c that is both larger than L1 and more distant from the arithmetic and logic circuitry. CPU 238 may be operated to interact with memory controller 220 in any of several modes, including a "no-cache" mode and a "write-through" mode. In a no-cache mode, CPU 238 does not use data caches 232b, 232c; instead the CPU 238 retrieves every item of data to be used from memory and sends every processing result to be stored to memory over bus 214 using memory controller 220. In a write-through mode, every result written to data cache 232b or 232c is immediately also sent to memory controller 220 over bus 214 for storage in memory 220.

Memory controller 220 includes a request queue 222 for storing requests to access memory, and one or more bank state machines 224. The use of a request queue 222 and bank state machines 224 in a memory controller are well known in the art and are described, for example, in U.S. Pat. No. 6,026,464 entitled "Memory control system and method utilizing distributed memory controllers for multibank memory", the entire contents of which are hereby incorporated by references as if fully set forth herein. The request queue stores a sequence of read and write requests received over device bus 214 so that the requested operations are performed in the correct order. Each read or write request, described in more detail below, is indicated by data stored in the request queue in a request record 223. The memory controller 220 includes logic circuits, called a "request queue manger," to preserve the order of read and write operations and to select the appropriate time and bank state machine (BSM) 224 to carry out a requested operation. The request queue manager includes an address compare function to determine whether the memory address specified in a request is the same as an address specified in one of the bank state machines 224 or in another request higher in the queue.

A bank state machine (BSM) 224 receives a command from the request queue manager to read data from memory or write data to memory. Each BSM operates on one bank of memory at one time. The BSM 224 indicates to the request queue manager when the BSM is occupied with executing a memory operation and when the BSM is available for the next memory operation on the same or a different bank of memory. In an illustrated embodiment, the memory controller 220 includes three BSMs 224a, 224b, 224c so that memory controller 220 can operate on three different banks of memory 270 at one time, while the request queue manger is determining the next request to process and the affected memory bank involved with that request. In other embodiments, more or fewer BSMs are included in memory controller 220.

According to some embodiments of the invention, the memory controller 220 includes one or more registers 225a, 225b, 225c (collectively referenced hereinafter as registers 225) associated with each BSM 224. In the illustrated embodiment, registers 225a, 225b, 225c are associated with BSMs 224a, 224b, 224c, respectively. Although shown as separate from BSMs 224 in FIG. 2B, in some embodiments, the registers 225 are included within the associated BSM; e.g., registers 225a is included within BSM 224a.

According to some embodiments, the memory controller 220 includes one or more registers 226 that are not associated with a BSM and that can be set by an external component, such as by CPU 238.

Figure 2C:
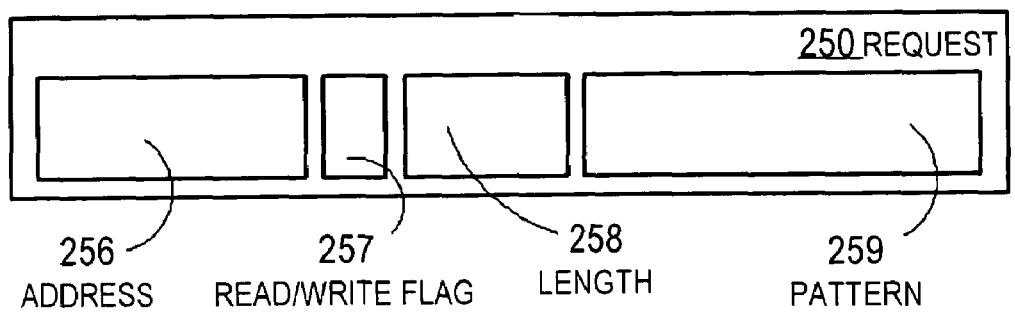
FIG. 2C is a block diagram that illustrates a request from a CPU to set an arbitrary portion of memory to an arbitrary pattern of bits, according to an embodiment.

FIG. 2C is a block diagram that illustrates a request 250 from a CPU to set an arbitrary portion of memory to an arbitrary pattern of bits, also called a bulk initialization write, according to an embodiment. A request record 223 stored in a request queue 222 of memory controller 220 is based on request 250. The request 250 includes an address field 256, a read/write flag field 257, a length field 258, and a pattern field

259. Although shown in a particular sequence in request 250, in other embodiments the fields may be arranged in a different sequence or interspersed with each other.

In some prior art memory controllers, the request is a 40 byte, 5 clock cycle data burst received by a memory controller on device bus 214. Eight bytes of the data burst are received on each clock cycle. The first eight bytes (64 bits) of the data burst, received on the first clock cycle, indicate a memory address and how much of the following 32 bytes on the next four clock cycles are to be written to that address in memory. In an illustrated embodiment, 36 bits in the first eight bytes specify the bank, page and location within the page of a memory address with a granularity of one byte. Five bits in the first eight bytes specify the length of the data to be stored starting at that location in bytes. Five bits is enough to signify a number of bytes from 1 to 32. A read request consumes only eight bytes to specify the starting address and length of data to be retrieved; but, the response consumes 32 bytes in four clock cycles to return the requested data from memory. Thus, in some previous approaches, the request includes an address field of 36 bits that specifies a starting address in memory, a one bit read/write flag field that indicates whether to read or write data starting at that address, a length field of 5 bits to specify how much of a maximum of 32 bytes are to be transferred to or from memory, and a data field of 32 bytes (256 bits) to hold the data, if any, to be written to or returned from memory. In some embodiments, each request or each record in the request queue, or both, is made up of a variable number of 8 byte segments. In such embodiments one segment specifies the address, flag and length followed by zero to four eight-byte segments that contain the data to be written to memory, or returned from memory.

According to some embodiments, the request and the request record are modified to indicate a bulk initialization write. For example, the length field in the data burst or request record of the previous approaches, or both is replaced by the length field 258 that indicates a portion of memory that is typically much greater than 32 bytes. Similarly, the data field in the data burst or request record of the previous approaches, or both, is replaced by a pattern field 259 that is to be repeated throughout the number of bytes indicated in the length field 258. Consequently, the number of bytes in the pattern field 259 is much less than the number of bytes indicated in the length field 258. In some embodiments, the read/write flag field 227 is more than one bit to allow its contents to distinguish at least three types of memory operations, including distinguishing a bulk initialization write from a normal read or write to memory.

In an illustrated embodiment, the address field 256 in a request 250 is 36 bits to specify a starting address in memory 270 up to 64 gigabytes (1 gigabyte, GB, =$2^{30}$ bytes). The flag field 227 is two bits to specify one of a read or write or bulk initialization write to memory. The length field is 36 bits to indicate a length up to the full extent of addressable memory. The pattern field 259 is 64 bits. In some embodiments, 128 bits are used for the pattern data. In other embodiments, the total bytes of a data burst of the same or different size are divided in other ways to specify the starting address, the length, and the pattern data. The length is any data that indicates the amount of memory to be initialized, e.g., the length data may be the actual memory address that ends the portion of the memory to be initialized. In some embodiments, most of the information to set up the bulk initialization (such as the length of the memory portion to be initialized, the pattern and the pattern size) is sent ahead of the CPU command that is eventually sent to start the initialization.

In a preferred embodiment, the size of the pattern equals an integral dividend of the number of bytes the memory controller 220 can transfer to memory 270 in a data burst; so an even number of patterns can be written to memory on each data burst. For example, for a maximum data burst of 32 bytes from memory controller 220 to memory 270, a 64-bit pattern equals 32 bytes divided by the integer four; so four complete patterns can be written with each data burst. The 128-bit pattern equals 32 bytes divided by the integer two; so two complete patterns can be written with each data burst.

In all embodiments, unlike the previous approaches, the number of bits in the pattern data is much less than the value indicated by the length data.

In some embodiments, the length field 258 includes a pattern length field and a memory portion length field. The memory portion length field corresponds to the size of memory to be initialized, as described above. The pattern length field indicates the length of the pattern data field. In some embodiments, the pattern length field is used to distinguish among different pattern sizes, for example between 64-bit and 128-bit patterns. In some embodiments, the pattern length field is used to write only a portion of a standard pattern length. For example, with a standard pattern length of 64 bits, a pattern length field can be set to 16 bits to indicate that only the first 16 bits of every 64 bits should be initialized in the portion of memory specified by the memory portion length field. Such an embodiment creates stripes of initialized and un-initialized regions in a contiguous portion of memory.

3.0 Functional Overview

According to some embodiments, memory controller 220 is modified to perform a bulk initialization write for an arbitrary portion of memory using an arbitrary repeating pattern of bits in response to a bulk initialization write request, such as request 250, issued to the device bus 214. In some embodiments, the memory controller 220 determines that a request is a bulk initialization request based on a code in the flag field 257 of a request 250. In some embodiments, the memory controller determines that a request is a bulk initialization request based on a value greater than 32 in the length field 258 of a request 250.

Figure 3:
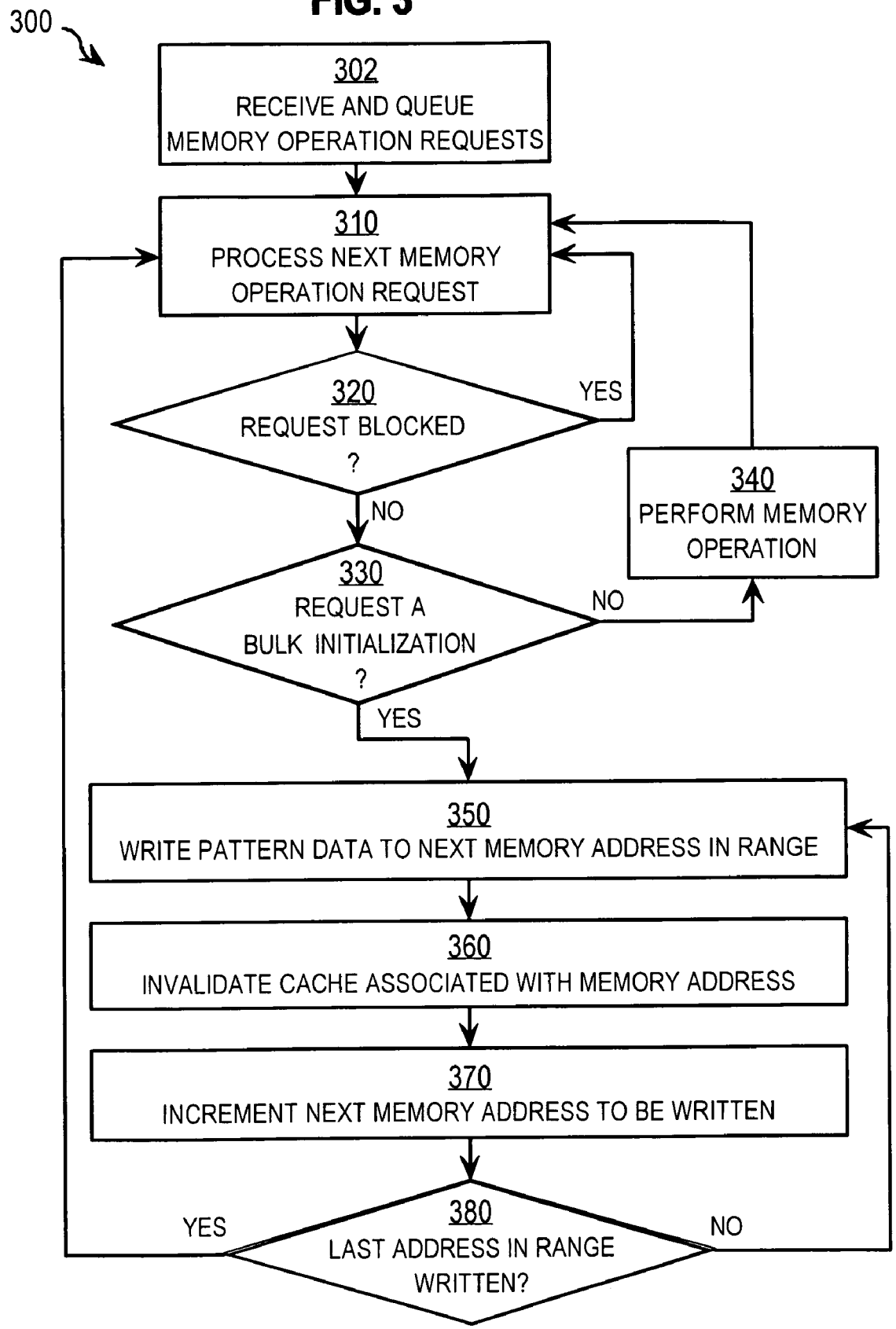
FIG. 3 is a flow diagram that illustrates at a high level a method for initializing an arbitrary portion of memory with an arbitrary pattern of bits, according to an embodiment.

FIG. 3 is a flow diagram that illustrates at a high level a method 300 for initializing an arbitrary portion of memory with an arbitrary pattern of bits, according to an embodiment. Although steps are depicted in FIG. 3, and subsequent flow diagrams, in a particular order for the purposes of illustration, in other embodiments one or more steps may be performed in a different order, or overlapping in time, or may be omitted entirely.

In step 302, a memory controller receives a request for a memory operation and places the request in a request queue to preserve the sequence of memory operations on the same memory address, if any. Using a request queue, the CPU 238 and other devices on device bus 214 using the memory controller 220 need not wait or ascertain whether the memory controller has completed a memory operation or not before issuing a subsequent request to access the same memory address.

In step 310, a request queue manager processes the next memory operation request record in the request queue. The next request record is at the top of the queue 222, unless the request has been skipped as described in step 320.

In step 320, it is determined whether the memory address in the next request is an address that is being operated upon by the memory controller. If so, the request is said to be "blocked." A blocked request is not satisfied, and control passes back to step 310 to get the next request in the queue. In some embodiments, step 320 is omitted.

An advantage of including step 320 is that the memory controller is not idle when several memory operations are queued up for the same location in memory, but instead, the memory controller operates on a different memory location while the multiple requests for the same memory location are processed in order. The request manager assures the correct sequence of memory operations by starting at the top of the request queue and skipping all memory operations involving a memory address currently being operated on by the memory controller. Any method known in the art may be used to determine whether the next address is being operated on by the memory controller. For example, in some embodiments it is determined whether one of the BSMs in the memory controller is currently operating on that memory address. In an illustrated embodiment, step 320 reads a memory address in the registers 225 associated with the BSMs 224.

In some embodiments supporting a bulk initialization write, the register 225 includes data indicating the range of memory addresses to be initialized, and all requests involving memory addresses in the range are blocked. In an illustrated embodiment, described in more detail below, the start of the range stored in register 225 is updated as the associated BSM writes an initialization pattern to each location in memory. Therefore, in such embodiments, the request manager does not block a subsequent request involving a memory address within the original range if that memory address has already been initialized —even though the BSM has not finished initializing all memory addresses in the original range.

If the next request is not blocked, control passes to step 330. In step 330, it is determined whether the next request is a bulk initialization write. Any method may be used to determine whether the request indicated by the next request record is a bulk initialization write. In some embodiments, the contents of the flag field 257 in or associated with the request record 223 indicate whether the operation is a bulk initialization write. For example, a flag value of 3 indicates a bulk initialization write. In some embodiments the contents of the length field 258 in or associated with the request record 223 indicate a value greater than 32 when the operation is a bulk initialization write.

If it is determined in step 330 that the request is not for a bulk initialization write, control passes to step 340 to perform the requested memory operation in a manner specified by the memory devices being accessed. Any known method for performing the memory operation may be used in step 340. For example the Joint Electron Device Engineering Council (JEDEC) specifies methods to access memory for SDRAM and DDR SDRAM, as is well known in the art.

If it is determined in step 330 that the request is for a bulk initialization write, control passes to step 350. In step 350, the initialization bits based on the pattern data are written beginning at the next memory address. In some embodiments, the pattern data is found in the request record 223; in some embodiments, the pattern data is found in a separate register, such as register 226. In some embodiments the pattern data bits are replicated to use a large or maximum data burst to write to memory in step 350. For example, if a memory is configured to accept 32 bytes of data in a data burst and the pattern data includes 8 bytes of initialization bits, then the 8 bytes are replicated three additional times to form 32 bytes and the 32 bytes are written starting at the next memory address.

In step 360, an invalidate command is generated for the device bus that indicates that any cached data associated with the current memory address is now invalid (dirty), because that memory address has been overwritten with initialization data. As used herein, a command is a set of signals sent along a bus, usually simultaneously, to indicate an action to be taken by a processor. Many current CPUs, such as MIPS TECHNOLOGIES™ processors, are configured to manage cache and to handle invalidate commands from a memory controller. In some embodiments, step 360 is performed after the last address in the range has been written, as determined in step 380 described below, rather than after each write to memory. In some embodiments step 360 is omitted. For example, step 360 is omitted in some embodiments that use a no-cache mode for the CPU.

In step 370, the next address to be written is incremented. The address is incremented by an appropriate increment depending on the number of bytes written during step 350. For example, if the address is specified by the position of a byte in memory, and 32 bytes of initialization data are written during step 350, then the memory address is incremented by 32 during step 370. In some embodiments, the next address to be written is copied to a register, such as one of the registers 225 associated with a BSM 224. In some embodiments the register to which the next memory address is written is used to determine whether a subsequent memory operation request is blocked in step 320, as described above.

In step 380, it is determined whether the last memory address in the original range of memory addresses indicated by the start address and the length has been written. Any method may be used. In some embodiments, the length is decremented in step 350 with each write to memory and step 380 is performed by determining whether the length has been reduced to zero. In some embodiments, the last memory address in the range is determined based on the start address and the length, the next memory address is incremented in step 370, and step 380 is performed by determining whether the next memory address has passed the last memory address in the range.

If is determined in step 380 that the last memory address has not been written, control passes back to step 350 to write the initialization pattern starting at the next memory address, such as the incremented memory address determined in step 370. If it is determined that the last memory address has been written, control passes back to step 310 to process the next memory operation request in the queue.

4.0 Example Embodiment

The method 300 is now illustrated in greater detail for a memory controller with a request queue manager and three BSMs. For purposes of illustration, it is assumed that a 4000 entry hash table is to be initialized, that each entry in the hash table is four bytes in size, and that the four bytes are to be filled with two bytes of zeros followed by two bytes of ones. This particular four byte pattern can be represented by the hexadecimal number (conventionally designated by a leading 0x) 0x0000FFFF, where each byte is represented by two hexadecimal digits. It is further assumed for purposes of illustration that a memory request comprises a 40 byte data burst, that 26 bits are devoted to a length field 258, that the size of the pattern data field 259 is fixed at 64 bits, that the memory controller 220 writes to memory 270 with a maximum payload of 32 bytes of data, and that a bulk initialization write is indicated by a read/write flag field 257 set to write and a length field 258 with contents that indicate a value greater than 32.

Figure 4:
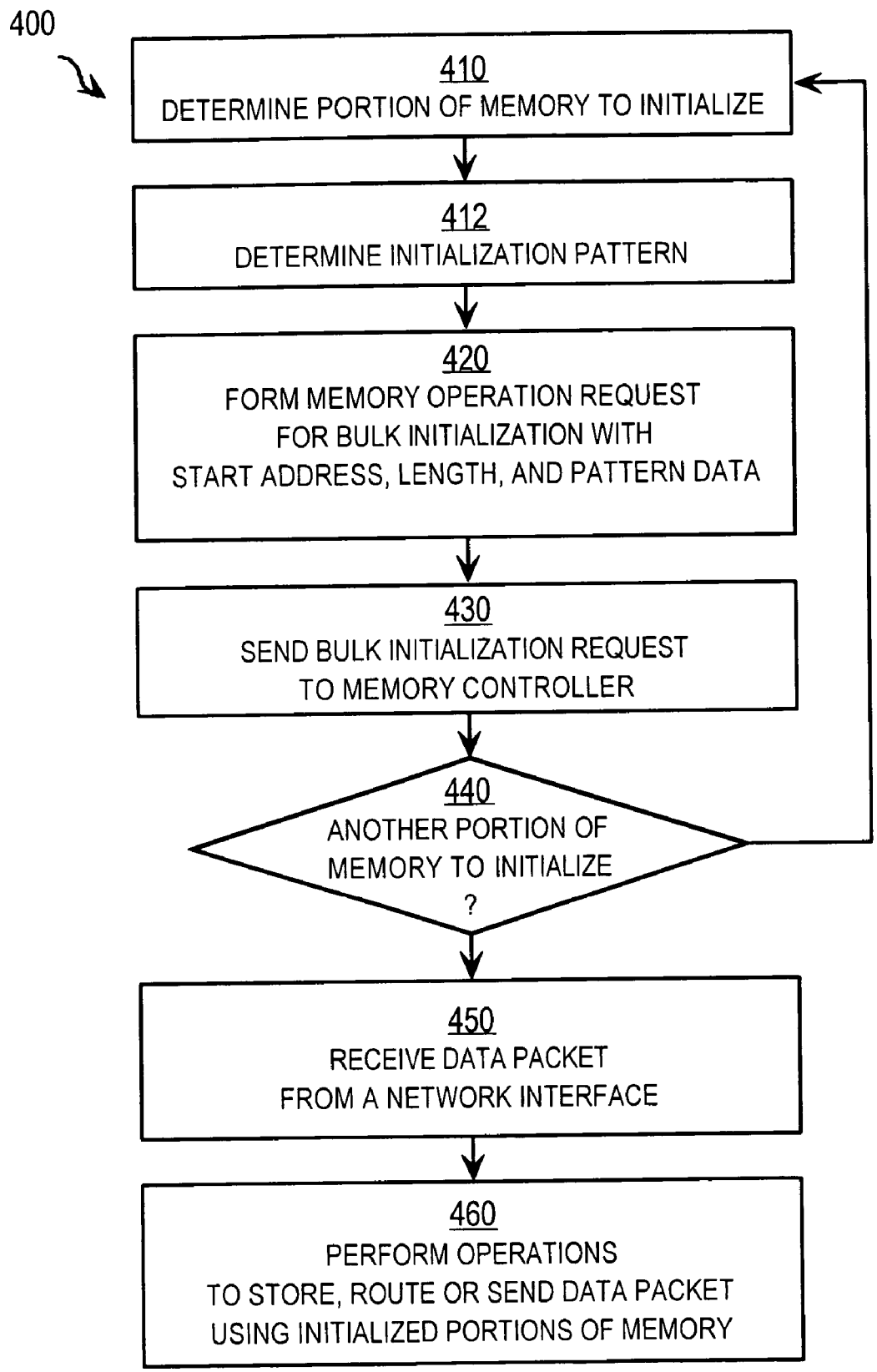
FIG. 4 is a flow diagram that illustrates a method performed in a CPU for initializing an arbitrary portion of memory, according to an embodiment.

FIG. 4 is a flow diagram that illustrates a method 400 performed in a CPU for initializing an arbitrary portion of memory, according to an embodiment. The CPU performs steps in FIG. 4 based on executing instructions in a program.

In step 410, the CPU determines a portion of memory to initialize. For example, the CPU 238 determines to initialize memory for the 4000 entry hash table beginning at memory address 85,101, i.e., the $85,101^{st}$ byte in memory. Because each entry involves four bytes, the portion of memory to be initialized is 16,000 bytes. Thus the portion of memory to be initialized extends from the $85,101^{st}$ byte to the $101,101^{st}$ byte in memory. In some embodiments, the portion of memory to be initialized is poorly aligned (e.g., is not a power of 2) with respect to a 32 byte data burst. To handle such embodiments, bit masks called byte enables, well known in the art, are typically used to insure that addresses before the start or beyond the end of the bulk initialization region are not written. In some embodiments, a logic circuit may impose some alignment restrictions; however, alignment restrictions are not necessay in every embodiment.

In step 412, the CPU determines the initialization pattern. For example, the CPU determines that the initialization pattern is 0x0000FFFF based on the program being executed.

In step 420, a bulk initialization write request 250 is formed that includes a start address, length and pattern data. In some embodiments, each memory request for ordinary read and write operations is an eight byte to 40 byte data burst that includes eight bytes of address, flag, and length fields and may include up to 32 bytes of a data field. The memory request 250 for a bulk write in these embodiments includes only the address field 256 and flag field 257 in the first eight bytes, includes the length field 258 as the first 36 bits of the next eight bytes, and includes the pattern field 259 as the next eight bytes. The total data burst is only 24 bytes. In some embodiments, the pattern data or the length data or both are not included in the request 250, but are written by the CPU directly into one or more registers in the memory controller, such as a register 226.

In an illustrated embodiment, a 40 byte request 250 is used for bulk initialization writes. For example, the address field 256 is 36 bits in the first 8 bytes that represent the decimal value 85,101 for the start address and the read/write flag field 257 is one bit that represents write; the length field 258 is 36 bits in the second eight bytes that represent the decimal value 16,000; and the pattern field 259 is the third eight bytes that represent the value 0x0000FFFF0000FFFF. Note that the four byte initialization bit pattern 0x0000FFFF is repeated to fill the eight byte fixed-size pattern field 259. The last sixteen bytes of the data burst are filled with zeroes and are ignored.

In step 430, a single bulk initialization request is sent to the memory controller. For example the 40 byte data burst with bulk initialization request 250 is placed on the device bus 214 for receipt and processing by the memory controller 220.

It is noted that using prior approaches to initialize the same 16,000 byte portion of memory, the CPU would have to issue multiple data bursts that consume many more CPU and device bus resources. For example, the CPU might issue 4000 data bursts each with a different memory address from 85101 to 101,101 in increments of 4 in the address field, a write flag, a length field containing a value of 4 to indicate four bytes of data, and a data field containing the value 0x0000FFFF. With additional CPU computations a slightly more efficient series of writes could be performed with 500 data bursts each with a different memory address from 85,101 to 101,101 in increments of 32 in the address field, a write flag, a length field containing a value of 32 to indicate 32 bytes of data, and a data field containing the digit pattern 0x0000FFFF repeated eight times.

In step 440 it is determined whether another portion of memory is to be initialized. If so, control passes back to step 410 to determine the next portion of memory to initialize. For example, in some embodiments, the CPU also initializes one or more descriptor rings. If no more portions of memory remain to be initialized, control passes to step 450. It is noted that the CPU does not wait for the memory controller to complete the initialization of the first portion of memory before requesting an initialization of a second or subsequent portion of memory.

In step 450, the CPU receives data from a data packet from a network interface. It is noted that the CPU does not wait for the memory controller to complete the initialization of the memory before receiving data from a data packet.

In step 460, the CPU performs operations to store, route and send the data packet to another network node using the initialized portions of memory. It is noted that the CPU does not wait for the memory controller to complete the initialization of the memory before performing these operations. Instead, the CPU relies on the memory controller to complete the initialization before executing memory operations that depend on the initialized values.

For example, during step 460, the CPU determines the signature of the data packet received in step 450, uses a hash function to compute an entry in the hash table, and sends a read memory request to the memory controller to retrieve the contents of memory at that hash table entry. The memory controller does not respond to the request until after that location in memory has been initialized. After that location in memory is initialized, the memory controller executes the read memory request and returns a data burst with a value of 0x0000FFFF for that hash table entry. Based on the value 0x0000FFFF, the CPU determines that a new link list must be started for this particular entry in the hash table. The CPU then generates the linked list and stores associated information in the hash data table at the location in memory.

Using the steps described in FIG. 4, the CPU and device bus 214 are free to perform other routing operating system functions even while a portion of memory is being initialized.

If the CPU caches memory, then the cache for the portion of memory to be initialized is invalid (dirty) after the CPU issues a request to start the bulk initialization. In some embodiments, the cache lines corresponding to memory portions undergoing bulk initialization are marked as dirty (hence unavailable in cache) by the CPU, either immediately before or immediately after issuing the bulk initialization request. This prevents the CPU from reading a previously read memory location that is going to be initialized and then using this out-of-date value. A disadvantage of such embodiments is that much CPU time might be consumed in marking cache lines that are associated with the bulk initialization portion of memory as dirty. Marking such cache as dirty may involve thousands of invalidate instructions at the CPU.

In some embodiments, the CPU performs other work while the initialization is going on. When the CPU is eventually ready to operate on the data in the initialized portion of memory, the CPU begins by marking as dirty only the last memory address to be initialized (which is an operation that consumes very few resources); and then performs a read to that location. This read will force a read request be sent to the DMA controller, because that location in cache is dirty. The memory controller will block the read response (stalling the CPU) until the initialization is complete and the last memory address is initialized. In these embodiments, the CPU does not issue another read or write to the initialized portion of memory until the request for the last memory address is answered.

FIG. 5A is a flow diagram that illustrates a method 501 performed by a request queue manager in a memory controller, according to an embodiment.

In step 502, a bulk initialization write request including an address, a length and pattern data is received from the device bus. For example, memory controller 220 receives request 250 with the start address field 256 holding data indicating the decimal value 85,101 for the start address, and the flag field 257 holding data indicating a write to memory. The length field 258 holds data indicating 16,000 bytes, so a bulk initialization write is indicated. The eight byte fixed-size pattern field 259 holds the value 0x0000FFFF0000FFFF.

In step 504 the request queue and registers are updated based on the received request. In some embodiments, some of the contents of the request are stored in the request queue and other contents are stored in one or more registers in the memory controller outside the request queue, such as registers 225 associated with the BSMs 224 or register 226 not associated with a BSM. For example, in some embodiments, the pattern data 0x0000FFFF0000FFF is placed in an eight byte register 226 and data from the rest of the fields is placed into a 16 byte request record 223 in the request queue 222.

In an illustrated embodiment, a 40 byte request record 223 based on request 250 is inserted into the request queue 222 for all reads, writes and bulk initialization writes. Thus, in the illustrated embodiment, the pattern data 0x0000FFFF0000FFFF is placed in the request record 223 of the request queue 222.

In step 506 the request queue is advanced. For example, a pointer indicates the next request record in the request queue holding the next memory operation to be performed. When a request is transferred to a BSM to be performed by that BSM, the record holding that request is purged from the queue and the records in the queue below the purged record are moved up in the queue, or the pointer is moved down. Any method, such as linked lists, may be used to maintain the sequence and advance the queue after each request is purged. For example, the request queue is advanced until the bulk initialization write request, described above, is the next request record in the queue.

In step 510, the memory address in the next request record is compared to the memory addresses associated with the BSMs. Any method may be used to perform this comparison. In some embodiments, an address comparator in the request queue manager compares the address in the request record to an address in an address register associated with each BSM. In an illustrated embodiment, the registers 225a, 225b, 225c associated with BSM 224a, 224b, 224c, respectively, hold data indicating the memory address each BSM is currently operating on. If a BSM 224 is idle, the corresponding register 225 holds a special value, such as all zeroes, indicating an idle BSM.

According to some embodiments, the registers 225 associated with each BSM include several fields associated with a bulk initialization write. For example, in the illustrated embodiment, a register 225 holds a first field for the current address the BSM is operating on, and a second field for the last address of the bulk initialization write. In some embodiments the second field holds a size of the initialized portion of memory still left to be initialized. In some embodiments, the first field holds a size of the initialized portion of memory still left to be initialized and the second field holds the last address of a bulk initialization write.

It is assumed for purposes of illustration that all three BSMs are idle and the registers 225 contain all zeroes.

In step 512, it is determined whether the memory address in the next request is an address that is being updated by one of the BSMs. If so, the request is blocked and control passes to step 514. In an illustrated embodiment, step 512 includes determining whether the memory address is in a range of addresses from the current address the BSM is operating on in the first field of register 225 and a last address of a bulk initialization write in a second field for the register 225.

In step 514 a pointer is advanced to the next request record in the queue. The next record is a record that does not involve a memory address that also appears higher in the queue, so that sequential operations on the same memory address are performed in the correct order. Control then passes back to step 510 to compare the next address to those being updated by the BSMs.

If it is determined during step 512 that the memory address in the next request is an address that is not being updated by one of the BSMs, then the next request is not blocked and control passes to step 518. In step 518, the request is assigned to an available BSM and a command is issued to the assigned BSM to perform the memory operation. The request record is then purged from the request queue, and control passes back to step 506 to advance the request records in the request queue.

In an example when all BSMs are idle, it is determined in step 512 that the request record based on the bulk initialization request 250 is not blocked and control passes to step 518. In the example, during step 518, the bulk initialization write is assigned to a BSM, e.g., BSM 224a, and a command is issued to BSM 224a to perform the bulk initialization write for 16000 bytes past the starting address 85,101 using the pattern 0000FFFF0000FFFF. The request queue manager then purges the request record from the request queue, and advances the request records in the request queue.

In other embodiments, alternative approaches are used to handle reads and writes to portions of memory being initialized. In one alternative embodiment, a read from a memory location to be initialized is serviced before the initialization is complete but the read data returned is based on the expected contents of the location given the pattern data and the start location. This embodiment allows the CPU to move on and get more work done. In yet another embodiment, the CPU read request is held off until the initialization is finished, this is the slowest performance solution. In the illustrated embodiment, described above, a read from a location is allowed only after the initialization to that specific location has completed. All these embodiments provide viable approaches to handle CPU reads from a memory block with initialization in progress. For writes to a memory location undergoing initialization, there are two favorable embodiments. In one embodiment, the write is delayed until the end of the entire initialization process. In the illustrated embodiment, the write is delayed until after the target address is initialized.

Figure 5B:
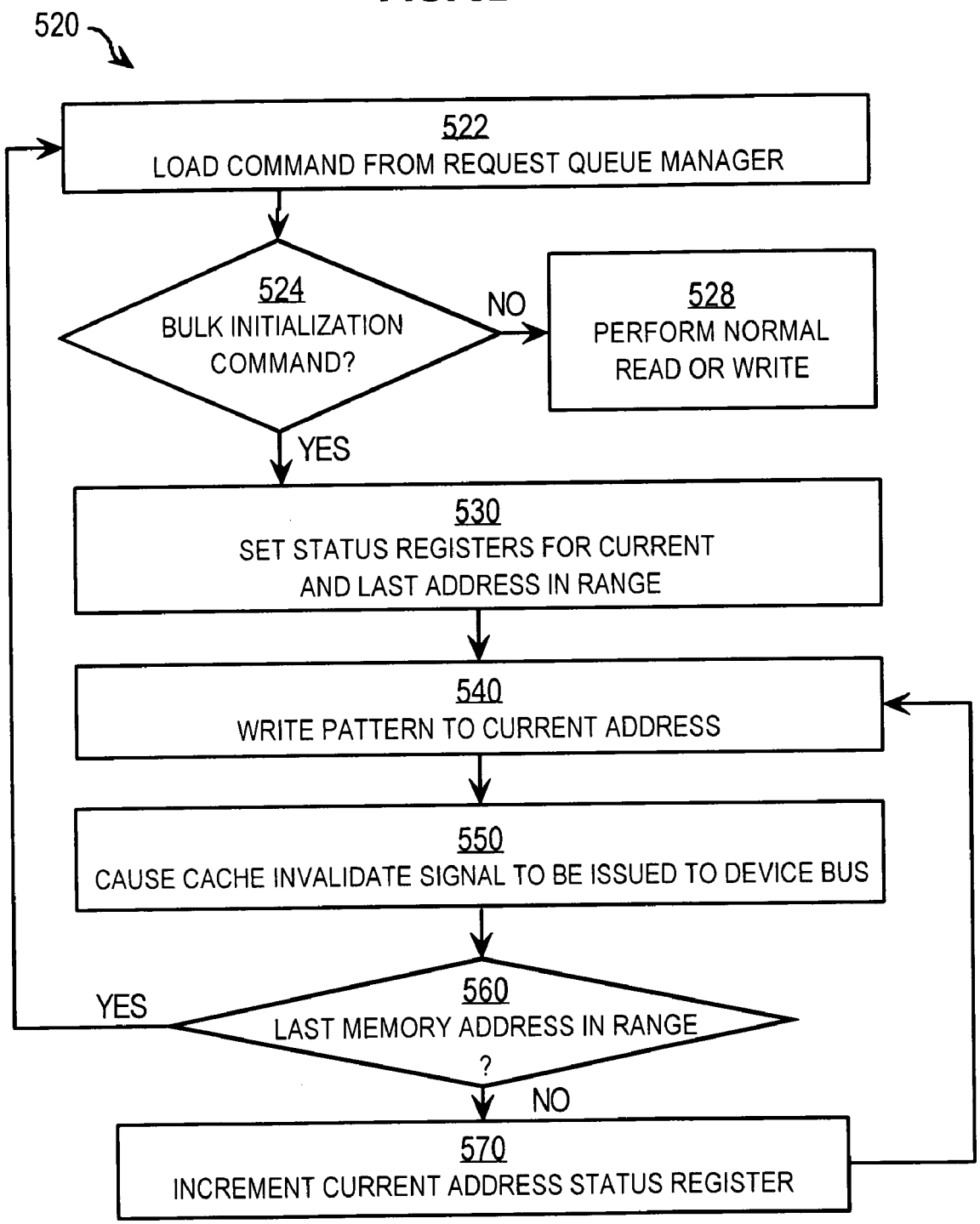
FIG. 5B is a flow diagram that illustrates a method performed by a bank state machine in a memory controller, according to an embodiment.

FIG. 5B is a flow diagram that illustrates a method 520 performed by a bank state machine (BSM) in a memory controller, according to an embodiment.

In step 522 a command from the request queue manger is loaded into the BSM. For example the command is loaded to perform the bulk initialization write for 16000 bytes past the starting address 85,101 using the pattern 0000FFFF0000FFFF.

In step 524 it is determined whether the command is to perform a bulk initialization write. If not, control passes to step 528 to perform a normal read or write using any method, such as prior approaches to read and write up to 32 bytes in memory.

If it is determined in step 524 that the command is for a bulk initialization write, control passes to step 530. In step 530, the registers 225 (called "status registers" in FIG. 5B) associated with the assigned BSM are set to indicate the first and last memory addresses to write. In the illustrated embodiments, step 530 includes copying the memory address to a register that is checked in step 510 to determine whether to block a subsequent memory operation to the same address. In some embodiments, step 530 includes determining the last memory address in the range of memory addresses based on the start address and the length field. In the illustrated embodiment, step 530 includes determining the number of bits of pattern data to write to each location in memory and the memory address increment. In some embodiments the request queue manager determines the number of bits of pattern data to write to each location in memory and the memory address increment before the request queue manager issues a command to the BSM.

For example, the memory address in the first field of register 225a associated with assigned BSM 224a is set to a value that indicates address 85,101. The second field of register 225a is used for the last memory address and set to a value that indicates address 101,101 by adding the length of 16,000 bytes to the start address. As stated above, it is assumed for purposes of illustration that it is most efficient for the BSM to write 32 bytes of data to memory in each data burst. Therefore, in an example embodiment, the BSM determines to quadruple the 8 bytes in the pattern data and write 32 bytes and to increment the memory address by 32 bytes after each write. In some embodiments the determination to quadruple the pattern data and memory address increment is made by the request queue manager before the request queue manager issues a command to the BSM.

In step 540, the pattern of bits is written to the current address. For example, 32 bytes (four replications of the eight byte pattern data 0x0000FFFF0000FFFF) are written to memory starting at 85,101.

In step 550, the BSM causes the memory controller to send an invalidate signal set (command) onto the device bus. Any method may be used to issue the invalidate command. For example, proprietary invalidate commands in use by RapidIO from Motorola and HyperTransport from AMD may be used. In an illustrated embodiment, the BSM 224a causes the memory controller 220 to send out on device bus 214 a command that indicates that contents stored in cache for memory addresses 85,101 through 85,132 are invalid because the contents of memory at those locations have been changed.

In step 560 it is determined whether the last memory address in the range has been written. If so, the bulk initialization write is complete, and control passes back to step 522 to load in another command. In some embodiments, step 560 includes setting the status register 225 associated with the BSM to indicate that the BSM is idle if the last memory address has been written. If it is determined in step 560 that the last memory address in the range has not been written, control passes to step 570.

For example, in step 560 it is determined that the last memory address 101,101 has not been written by writing to addresses 85,101 to 85,132, so control passes to step 570.

In step 570, the current memory address to write is incremented in the status register 225 associated with the BSM. For example, the address 85,101 in the register 225a is incremented by 32 to indicate that the current memory address to be written by BSM 224a is 85,133.

In some embodiments, step 570 includes determining to change the increment or number of bits to write in order to prevent the last write from exceeding the portion of memory to be initialized. For example, if the portion of memory to be initialize were not a multiple of 32 bytes, then the last write to memory would be reduced to be less than 32 bytes.

Control then passes back to step 540 to write the pattern data to the current memory address. For example, 32 bytes (four replications of the eight byte pattern data 0x0000FFFF0000FFFF) are written to memory starting at 85,133.

Using embodiments described herein, a CPU can initialize a large arbitrary portion of memory with an arbitrary pattern of bit values with a single write request to a memory controller, rather than hundreds or thousands of write requests. Furthermore, the CPU may continue processing without polling the memory controller or waiting for an interrupt or otherwise consuming resources to determine when the memory controller has completed the requested initialization. The amount of CPU and device bus resources consumed are reduced many orders of magnitude using these embodiments.

5.0 Router Hardware Overview

Figure 6:
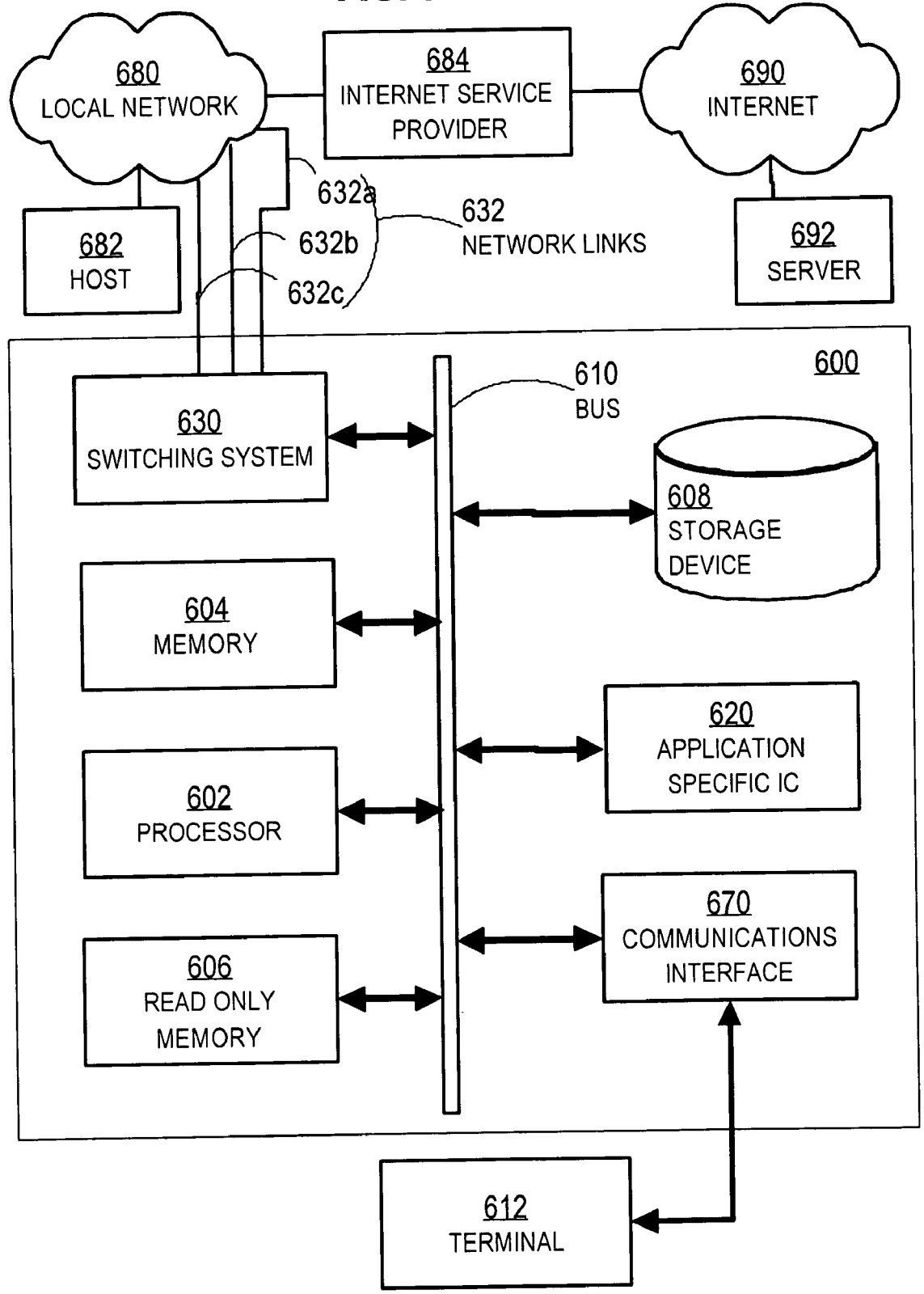
FIG. 6 is a block diagram that illustrates a router upon which an embodiment of the invention may be implemented.

FIG. 6 is a block diagram that illustrates a computer system 600 upon which an embodiment of the invention may be implemented. The preferred embodiment is implemented using one or more computer programs running on a network element such as a router device. Thus, in this embodiment, the computer system 600 is a router.

Computer system 600 includes a communication mechanism such as a bus 610 for passing information between other internal and external components of the computer system 600. Information is represented as physical signals of a measurable phenomenon, typically electric voltages, but including, in other embodiments, such phenomena as magnetic, electromagnetic, pressure, chemical, molecular, atomic and quantum interactions. For example, north and south magnetic fields, or a zero and non-zero electric voltage, represent two states (0, 1) of a binary digit (bit). A sequence of binary digits constitutes digital data that is used to represent a number or code for a character. A bus 610 includes many parallel conductors of information so that information is transferred quickly among devices coupled to the bus 610. One or more processors 602 for processing information are coupled with the bus 610. A processor 602 performs a set of operations on information. The set of operations include bringing information in from the bus 610 and placing information on the bus 610. The set of operations also typically include comparing two or more units of information, shifting positions of units of information, and combining two or more units of information, such as by addition or multiplication. A sequence of operations to be executed by the processor 602 constitute computer instructions.

Computer system 600 also includes a memory 604 coupled to bus 610. The memory 604, such as a random access memory (RAM) or other dynamic storage device, stores information including computer instructions. Dynamic memory allows information stored therein to be changed by the computer system 600. RAM allows a unit of information stored at a location called a memory address to be stored and retrieved independently of information at neighboring addresses. The memory 604 is also used by the processor 602 to store temporary values during execution of computer instructions. The computer system 600 also includes a read only memory (ROM) 606 or other static storage device coupled to the bus 610 for storing static information, including instructions, that is not changed by the computer system 600. Also coupled to bus 610 is a non-volatile (persistent) storage device 608, such as a magnetic disk or optical disk, for storing information, including instructions, that persists even when the computer system 600 is turned off or otherwise loses power.

The term computer-readable medium is used herein to refer to any medium that participates in providing information to processor 602, including instructions for execution. Such a medium may take many forms, including, but not limited to, non-volatile media, volatile media and transmission media. Non-volatile media include, for example, optical or magnetic disks, such as storage device 608. Volatile media include, for example, dynamic memory 604. Transmission media include, for example, coaxial cables, copper wire, fiber optic cables, and waves that travel through space without wires or cables, such as acoustic waves and electromagnetic waves, including radio, optical and infrared waves. Signals that are transmitted over transmission media are herein called carrier waves.

Common forms of computer-readable media include, for example, a floppy disk, a flexible disk, a hard disk, a magnetic tape or any other magnetic medium, a compact disk ROM (CD-ROM), a digital video disk (DVD) or any other optical medium, punch cards, paper tape, or any other physical medium with patterns of holes, a RAM, a programmable ROM (PROM), an erasable PROM (EPROM), a FLASH-EPROM, or any other memory chip or cartridge, a carrier wave, or any other medium from which a computer can read.

Information, including instructions, is provided to the bus 610 for use by the processor from an external terminal 612, such as a terminal with a keyboard containing alphanumeric keys operated by a human user, or a sensor. A sensor detects conditions in its vicinity and transforms those detections into signals compatible with the signals used to represent information in computer system 600. Other external components of terminal 612 coupled to bus 610, used primarily for interacting with humans, include a display device, such as a cathode ray tube (CRT) or a liquid crystal display (LCD) or a plasma screen, for presenting images, and a pointing device, such as a mouse or a trackball or cursor direction keys, for controlling a position of a small cursor image presented on the display and issuing commands associated with graphical elements presented on the display of terminal 612. In some embodiments, terminal 612 is omitted.

Computer system 600 also includes one or more instances of a communications interface 670 coupled to bus 610. Communication interface 670 provides a two-way communication coupling to a variety of external devices that operate with their own processors, such as printers, scanners, external disks, and terminal 612. Firmware or software running in the computer system 600 provides a terminal interface or character-based command interface so that external commands can be given to the computer system. For example, communication interface 670 may be a parallel port or a serial port such as an RS-232 or RS-422 interface, or a universal serial bus (USB) port on a personal computer. In some embodiments, communications interface 670 is an integrated services digital network (ISDN) card or a digital subscriber line (DSL) card or a telephone modem that provides an information communication connection to a corresponding type of telephone line. In some embodiments, a communication interface 670 is a cable modem that converts signals on bus 610 into signals for a communication connection over a coaxial cable or into optical signals for a communication connection over a fiber optic cable. As another example, communications interface 670 may be a local area network (LAN) card to provide a data communication connection to a compatible LAN, such as Ethernet. Wireless links may also be implemented. For wireless links, the communications interface 670 sends and receives electrical, acoustic or electromagnetic signals, including infrared and optical signals, which carry information streams, such as digital data. Such signals are examples of carrier waves In the illustrated embodiment, special purpose hardware, such as an application specific integrated circuit (IC) 620, is coupled to bus 610. The special purpose hardware is configured to perform operations not performed by processor 602 quickly enough for special purposes. Examples of an Application Specific Integrated Circuit (ASIC) include graphics accelerator cards for generating images for display, cryptographic boards for encrypting and decrypting messages sent over a network, speech recognition, and interfaces to special external devices, such as robotic arms and medical scanning equipment that repeatedly perform some complex sequence of operations that are more efficiently implemented in hardware.

In the illustrated computer used as a router, the computer system 600 includes switching system 630 as special purpose hardware for switching information for flow over a network. Switching system 630 typically includes multiple communications interfaces, such as communications interface 670, for coupling to multiple other devices. In general, each coupling is with a network link 632 that is connected to another device in or attached to a network, such as local network 680 in the illustrated embodiment, to which a variety of external devices with their own processors are connected. In some embodiments an input interface or an output interface or both are linked to each of one or more external network elements. Although three network links 632a, 632b, 632c are included in network links 632 in the illustrated embodiment, in other embodiments, more or fewer links are connected to switching system 630. Network links 632 typically provides information communication through one or more networks to other devices that use or process the information. For example, network link 632b may provide a connection through local network 680 to a host computer 682 or to equipment 684 operated by an Internet Service Provider (ISP). ISP equipment 684 in turn provides data communication services through the public, world-wide packet-switching communication network of networks now commonly referred to as the Internet 690. A computer called a server 692 connected to a network provides service in response to information received over a network. In the illustrated example, server 692 connected to the Internet provides a service in response to information received over the Internet. For example, server 692 provides routing information for use with switching system 630.

The switching system 630 includes logic and circuitry configured to perform switching functions associated with passing information among elements of network 680, including passing information received along one network link, e.g. 632a, as output on the same or different network link, e.g., 632c. The switching system 630 switches information traffic arriving on an input interface to an output interface according to pre-determined protocols and conventions that are well known. In some embodiments, switching system 630 includes its own processor and memory to perform some of the switching functions in software. In some embodiments, switching system 630 relies on processor 602, memory 604, ROM 606, storage 608, or some combination, to perform one or more switching functions in software. For example, switching system 630, in cooperation with processor 604 implementing a particular protocol, can determine a destination of a packet of data arriving on input interface on link 632a and send it to the correct destination using output interface on link 632c. The destinations may include host 682, server 692, other terminal devices connected to local network 680 or Internet 690, or other routing and switching devices in local network 680 or Internet 690.

The invention is related to the use of computer system 600 for implementing the techniques described herein. According to one embodiment of the invention, those techniques are performed by computer system 600 in response to processor 602 or switching system 630 executing one or more sequences of one or more instructions contained in memory, such as memory 604. Such instructions, also called software and program code, may be read into memory, such as memory 604, from another computer-readable medium such as storage device 608. Execution of the sequences of instructions contained in memory causes processor 602 or switching system 630 or both to perform the method steps described herein. In alternative embodiments, hardware, such as application specific integrated circuit 620 and circuits in switching system 630, may be used in place of or in combination with software to implement the invention. Thus, embodiments of the invention are not limited to any specific combination of hardware and software unless otherwise explicitly stated.

The signals transmitted over network link 632 and other networks through communications interfaces such as interface 670, which carry information to and from computer system 600, are exemplary forms of carrier waves. Computer system 600 can send and receive information, including program code, through the networks 680, 690 among others, through network links 632 and communications interfaces such as interface 670. In an example using the Internet 690, a server 692 transmits program code for a particular application, requested by a message sent from computer 600, through Internet 690, ISP equipment 684, local network 680 and network link 632b through communications interface in switching system 630. The received code may be executed by processor 602 or switching system 630 as it is received, or may be stored in storage device 608 or other non-volatile storage for later execution, or both. In this manner, computer system 600 may obtain application program code in the form of a carrier wave.

Various forms of computer readable media may be involved in carrying one or more sequence of instructions or data or both to processor 602 or switching system 630 for execution. For example, instructions and data may initially be carried on a magnetic disk of a remote computer such as host 682. The remote computer loads the instructions and data into its dynamic memory and sends the instructions and data over a telephone line using a modem. A modem local to the computer system 600 receives the instructions and data on a telephone line and uses an infra-red transmitter to convert the instructions and data to an infra-red signal, a carrier wave serving as the network link 632b. An infrared detector serving as communications interface 670 receives the instructions and data carried in the infrared signal and places information representing the instructions and data onto bus 610. Bus 610 carries the information to memory 604 from which processor 602 or switching system 630 retrieves and executes the instructions using some of the data sent with the instructions. The instructions and data received in memory 604 may optionally be stored on storage device 608, or switching system 630 either before or after execution by the processor 602 or switching system 630.

6.0 Extensions And Alternatives

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. An apparatus for performing sequenced read and write operations on a computer memory, comprising: a data communication channel; a processor in communication with the data communication channel; a memory comprising a computer-readable medium; and a memory controller circuit block configured for: receiving from the processor over the data communication channel a single command comprising: address data that indicates a location in memory, first length data that indicates an amount of memory to be initialized, pattern data comprising a particular plurality of bits, and second length data that indicates a length of the pattern data to be written to the memory, wherein the length of the pattern data is much shorter than the amount of memory to be initialized; and performing a plurality of write operations on memory beginning at a first location in memory based on the address data and ending at a second location in memory based on the first length data, wherein each write operation of the plurality of write operations writes the pattern data to a current location in memory, whereby an arbitrary portion of memory is initialized with an arbitrary pattern based on the pattern data.

2. The apparatus as recited in claim 1, the circuit block further configured for blocking a subsequent request for access to a particular location in memory in a range from the first location to the second location until after the pattern data is written to the particular location.

3. The apparatus as recited in claim 2, said blocking a subsequent request for access to a particular location in memory further comprising: incrementing, in a first register, address data that indicates a current location in memory where the pattern data is being written; determining whether the particular location is in a range from the current location to the second location; and if it is determined that the particular location is in the range from the current location to the second location, then blocking the subsequent request for access to the particular location.

4. The apparatus as recited in claim 3, said blocking a subsequent request for access to a particular location in memory further comprising, if it is determined that the particular location is in a range from the first location to a location before the current location, then satisfying the request for access to the particular location.

5. The apparatus as recited in claim 1, said performing the plurality of write operations further comprising sending on the data communication channel connected to the processor an invalidate signal set that indicates a particular memory location in a range from the first location to the second location to which the pattern data has been written, whereby contents of a portion of a cache of data in the processor associated with the particular memory location is not coherent with contents of the particular memory location.

6. The apparatus as recited in claim 5, said sending an invalidate signal set further comprising sending on the data communication channel connected to the processor a plurality of invalidate signal sets that each indicates a different memory location between the first location and the second location to which the pattern data has been written.

7. An apparatus for routing information in a data packet, comprising: a network interface that is coupled to a network for communicating therewith a data packet; a memory for storing information; one or more processors; a data communication channel connected to the one or more processors; a memory controller circuit block connected to the memory and connected to the data communication channel and configured for: receiving on the data communication channel a single command comprising: address data that indicates a location in memory, length data that indicates an amount of memory to be initialized, pattern data comprising a particular plurality of bits, and second length data that indicates a length of the pattern data to be written to the memory, wherein the length of the pattern data is much shorter than the amount of memory to be initialized; and performing a plurality of write operations to memory beginning at a first location in memory based on the address data and ending at a second location in memory based on the first length data, wherein each write operation of the plurality of write operations writes the pattern data to a current location in memory, whereby an arbitrary portion of memory is initialized with an arbitrary pattern based on the pattern data; and one or more sequences of instructions in a computer-readable medium, which, when executed by the one or more processors, causes the one or more processors to perform the steps of: initializing the arbitrary portion of memory for at least one of storing, routing and sending the data packet by sending to the memory controller the address data, the first length data, the pattern data, and the second length data, thereby omitting processor clock cycles that would otherwise be consumed in repeatedly sending the pattern data on the data communication channel for a plurality of memory locations in a range from the first location to the second location; and performing at least one of storing, routing and sending the data packet based at least in part on information subsequently stored in the arbitrary portion of memory.

8. The apparatus as recited in claim 7, wherein: the memory controller is further configured for blocking a subsequent request for access to a particular location in memory in a range from the first location to the second location until after the pattern data is written to the particular location; and said performing at least one of storing, routing and sending the data packet is performed at least in part while the memory controller is performing the plurality of write operations.

9. The apparatus as recited in claim 8, said blocking a subsequent request for access to the particular location in memory further comprising: incrementing, in a first register, address data that indicates a current location in memory where the pattern data is being written; determining whether the particular location is in a range from the current location to the second location; and if it is determined that the particular location is in the range from the current location to the second location, then blocking the subsequent request for access to the particular location.

10. The apparatus as recited in claim 9, said blocking a subsequent request for access to a particular location in memory further comprising, if it is determined that the particular location is in a range from the first location to a location before the current location, then satisfying the request for access to the particular location.

11. The apparatus as recited in claim 7, wherein: said performing the plurality of write operations further comprises sending on the data communication channel an invalidate signal set that indicates a particular memory location in a range from the first location to the second location to which the pattern data has been written; and based on the invalidate signal set, said one or more processors mark a portion of a cache of data in the one or more processors as not coherent with contents of the particular memory location associated with the portion of the cache.

12. The apparatus as recited in claim 11, said sending an invalidate signal set further comprising sending on the data communication channel a plurality of invalidate signal sets that each indicates a different memory location between the first location and the second location to which the pattern data has been written.

13. A memory controller for performing sequenced read and write operations to a computer memory, comprising: a means for receiving a single command on a data communication channel connected to a processor, the single command comprising: address data that indicates a location in memory, first length data that indicates an amount of memory to be initialized, pattern data comprising a particular plurality of bits, and second length data that indicates a length of the pattern data to be written to the memory, wherein the length of the pattern data is much shorter than the amount of memory to be initialized; and a means for performing a plurality of write operations to memory beginning at a first location in memory based on the address data and ending at a second location in memory based on the first length data, wherein each write operation of the plurality of write operations writes the pattern data to a current location in memory, whereby an arbitrary portion of memory is initialized with an arbitrary pattern based on the pattern data.

14. An apparatus for routing information in a data packet, comprising: a memory for storing information; one or more processors; a data communication channel connected to the one or more processors; a means for communicating a data packet; a means for sending on the data communication channel, from the one or more processors a single command comprising: address data that indicates a location in memory, first length data that indicates an amount of memory to be initialized, pattern data comprising a particular plurality of bits, and second length data that indicates a length of the pattern data to be written to the memory, wherein the length of the pattern data is much shorter than the amount of memory to be initialized; a means for receiving the address data, first length data, pattern data, and second length data on the data communication channel; and a means for performing a plurality of write operations to memory beginning at a first location in memory based on the address data and ending at a second location in memory based on the first length data, wherein each write operation of the plurality of write operations writes the pattern data to a current location in memory, whereby an arbitrary portion of memory is initialized with an arbitrary pattern based on the pattern data, whereby processor clock cycles are omitted that would otherwise be consumed in repeatedly sending the pattern data on the data communication channel for a plurality of memory locations in a range from the first location to the second location; and a means for performing at least one of storing, routing and sending the data packet based at least in part on information subsequently stored in the arbitrary portion of memory.

15. A method for a network device, which includes a general purpose processor configured to execute a router operating system, for initializing an arbitrary portion of memory with an arbitrary pattern, the method comprising the steps of: receiving a data packet at a network device; determining an arbitrary portion of memory to be initialized for performing at least one of storing, routing, and sending the data packet; determining a pattern of bits to use in initializing the portion of memory; sending, on a data communication channel connected to a memory controller, a single command comprising: address data that indicates a location in memory based on the arbitrary portion of memory, first length data that indicates a size of the portion of memory, pattern data, based on the pattern of bits, which pattern data comprises a particular plurality of bits, and second length data that indicates a length of the pattern data to be written to the memory, wherein the length of the pattern data is much shorter than the amount of memory to be initialized, whereby the memory controller performs a plurality of write operations to memory beginning at a first location in memory based on the address data and ending at a second location in memory based on the first length data, wherein each write operation of the plurality of write operations writes the pattern data to a current location in memory, thereby omitting processor clock cycles that would otherwise be consumed in repeatedly sending, on the data communication channel, the pattern data for a plurality of memory locations in the arbitrary portion of memory; and performing at least one of storing, routing and sending the data packet based at least in part on information subsequently stored in the arbitrary portion of memory.

16. The method as recited in claim 15, wherein said step of performing at least one of storing, routing and sending the data packet is performed at least in part while the memory controller is performing the plurality of write operations.

17. The method as recited in claim 15, further comprising: receiving on the data communication channel an invalidate signal set that indicates a particular memory location in a range from the first location to the second location to which the pattern data has been written; and based on the invalidate signal set, marking a portion of a cache of data in a processor as not coherent with contents of the particular memory location associated with the portion of the cache.

18. A computer-readable medium, excluding signals that are transmitted over transmission media, carrying one or more sequences of instructions for processing information in a payload of a first network protocol which payload includes header information for a second network protocol, wherein execution of the one or more sequences of instructions by one or more processors causes the one or more processors to perform the steps of: receiving a data packet at a network device; determining an arbitrary portion of memory to be initialized for performing at least one of storing, routing, and sending the data packet; determining a pattern of bits to use in initializing the portion of memory; sending, on a data communication channel connected to a memory controller, a single command comprising: address data that indicates a location in memory based on the arbitrary portion of memory, length data that indicates a size of the portion of memory, pattern data, based on the pattern of bits, which pattern data comprises a particular plurality of bits, and second length data that indicates a length of the pattern data to be written to the memory, wherein the length of the pattern data is much shorter than the amount of memory to be initialized, whereby the memory controller performs a plurality of write operations to memory beginning at a first location in memory based on the address data and ending at a second location in memory based on the first length data, wherein each write operation of the plurality of write operations writes the pattern data to a current location in memory, thereby omitting processor clock cycles that would otherwise be consumed in repeatedly sending the pattern data on the data communication channel for a plurality of memory locations in the portion of memory; and performing at least one of storing, routing and sending the data packet based at least in part on information subsequently stored in the arbitrary portion of memory.

19. The computer-readable medium, excluding signals that are transmitted over transmission media, as recited in claim 18, wherein said step of performing at least one of storing, routing and sending the data packet is performed at least in part while the memory controller is performing the plurality of write operations.

20. The computer-readable medium, excluding signals that are transmitted over transmission media, as recited in claim 18, wherein execution of the one or more sequences of instructions further causes the one or more processors to perform the steps of: receiving on the data communication channel an invalidate signal set that indicates a particular memory location in a range from the first location to the second location to which the pattern data has been written; and based on the invalidate signal set, marking a portion of a cache of data in a processor as not coherent with contents of the particular memory location associated with the portion of the cache.

21. A method for performing sequenced read and write operations on a computer memory, comprising the steps of: receiving on a first data communication channel connected to a processor a single command comprising: address data that indicates a location in memory, first length data that indicates an amount of memory to be initialized, pattern data comprising a particular plurality of bits, and second length data that indicates a length of the pattern data to be written to the memory, wherein the length of the pattern data is much shorter than the amount of memory to be initialized; and sending a plurality of write operations on a second different data communication channel connected to a memory, beginning at a first location in memory based on the address data and ending at a second location in memory based on the first length data, wherein each write operation of the plurality of write operations writes the pattern data to a current location in memory, whereby an arbitrary portion of memory is initialized with an arbitrary pattern based on the pattern data.

* * * * *